US007107190B1

(12) United States Patent
Tsuchiya et al.

(10) Patent No.: US 7,107,190 B1
(45) Date of Patent: Sep. 12, 2006

(54) CIRCUIT DESIGNING APPARATUS, CIRCUIT DESIGNING METHOD, AND COMPUTER READABLE RECORDING MEDIUM STORING A CIRCUIT DESIGNING PROGRAM

(75) Inventors: Takehiko Tsuchiya, Tokyo (JP); Eiichi Yano, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 695 days.

(21) Appl. No.: 09/606,148

(22) Filed: Jun. 29, 2000

(30) Foreign Application Priority Data

Jun. 30, 1999 (JP) ............................... 11-186819

(51) Int. Cl.
*G06F 17/50* (2006.01)

(52) U.S. Cl. ........................... 703/1; 703/15; 714/726; 716/1; 716/2; 716/4

(58) Field of Classification Search ................ 364/488, 364/489; 395/500; 716/4, 18, 17, 1, 2; 371/223, 371/224, 225, 226; 703/1; 714/726
See application file for complete search history.

(56) References Cited

U.S. PATENT DOCUMENTS 5,805,861 A * 9/1998 Gilbert et al. ................ 703/15
5,862,149 A * 1/1999 Carpenter et al. ........... 714/726
5,892,678 A * 4/1999 Tokunoh et al. ................ 716/2
5,910,898 A * 6/1999 Johannsen ...................... 716/1
5,912,819 A * 6/1999 Kucukcakar et al. ......... 716/19
6,449,750 B1 * 9/2002 Tsuchiya ........................ 716/4

FOREIGN PATENT DOCUMENTS

| JP | 6-76016 | 3/1994 |
| JP | 10-254914 | 9/1998 |
| JP | 10-320426 | 12/1998 |

OTHER PUBLICATIONS

U.S. Appl. No. 09/482,935, filed Sep. 10, 2002, Tsuchiya.
Notice of Grounds for Rejection issued by the Japanese Patent Office Mailed Mar. 28, 2006, for Japanese Patent Application No. H11-186819, and English-language translation thereof.

* cited by examiner

*Primary Examiner*—Anthony Knight
*Assistant Examiner*—Sunray Chang
(74) *Attorney, Agent, or Firm*—Finnegan, Henderson, Farabow, Garrett & Dunner, L.L.P.

(57) ABSTRACT

A circuit designing apparatus comprising: unit for specifying the changed points of the circuit description automatically in predetermined unit, and classifying the plural test vectors into those related with the changed points and others not; wherein the second and subsequent logic verification processes are executed by using only the test vectors relating to the changed points. As a result, the time required for circuit design can be substantially curtailed.

16 Claims, 5 Drawing Sheets

17a,b,c,d,e,f: LOGIC CONE
18a,b,c,d,e,f: REGISTER
19: INTEGRATED CIRCUIT 17a,b,c,d,e,f: LOGIC CONE
18a,b,c,d,e,f: REGISTER
19: INTEGRATED CIRCUIT

CIRCUIT DESIGNING APPARATUS, CIRCUIT DESIGNING METHOD, AND COMPUTER READABLE RECORDING MEDIUM STORING A CIRCUIT DESIGNING PROGRAM

BACKGROUND OF THE INVENTION

1. Field of the Invention

The present invention relates to a circuit designing apparatus for feeding test vectors in the circuit description defining the structure and specification of the circuit to be designed, comparing the output signal and an expected value of output signal to verify the logic of the circuit description, and fabricating an actual circuit by using this circuit description, a circuit designing method, and a computer-readable recording medium storing a circuit designing program, and more particularly to a technique of shortening the time required for logic verification of circuit description so as to curtail the time and expense required for circuit design processing substantially.

2. Description of the Related Art

At the present, in a general circuit designing process, first, a circuit description defining the structure and specification of a circuit to be designed is prepared, and after judging the validity of the circuit description, a mask pattern is made from the circuit description, and an actual circuit is fabricated.

One of the techniques for judging the validity of the circuit description made in this circuit designing process is a process known as logic verification (for example, function verification, timing verification, and the like) for checking if the function of the circuit to be designed is realized according to the specification or not. In logic verification process, plural test vectors compiled by each function desired to be checked by the designer are fed into the circuit description, and the output signal and an expected value of output signal are compared. If the output signal and its expected value are different, it is judged that the circuit description includes some inconvenience, and the defective position in the circuit description is corrected so as to realize a desired function.

However, this conventional logic verification process involves the following technical problems.

That is, usually, if any defect is detected in the circuit description by logic verification process, the defective position in the circuit description is corrected, but generally when the circuit description is changed, in order to check if a new unexpected bug (defective point) is mixed in by change, or check if the specification realized before is similarly realized after change, regardless of the content of change, it is necessary to process logic verification again by using all test vectors previously used in the logic verification process, and therefore in the conventional logic verification process, the time required for logic verification increases in proportion to the number of times of change of circuit description, possibly leading to a significant delay in the term of circuit designing process.

Besides, as the circuit to be designed is large in scale and complicated, the logic verification time required for one test vector is very long, and by the increase of the required verification items, the number of test vectors required for logic verification increases, and henceforth as the circuit becomes larger in scale and more complicated, such technical problems evidently become more and more serious.

SUMMARY OF THE INVENTION

The invention is devised in the light of the above technical problems, and it's object is to present a circuit designing apparatus capable of substantially curtailing the time required for circuit design.

Also, the other object of the invention is to present circuit designing method capable of substantially curtailing the time required for circuit design.

And also, the further object of the invention is to present a computer-readable recording medium storing a circuit designing program capable of substantially curtailing the time required for circuit design.

To cope with these technical problems, the present inventors devised means for specifying the changed points of the circuit description automatically in predetermined unit, and classifying the plural test vectors into those related with the changed points and others not, and succeeded in curtailing the time required for circuit design substantially because the logic verification is done by using only the test vectors relating to the changed points in the second process of logic verification and after.

On the basis of this concept, a first feature of the present invention relates to a circuit designing apparatus comprising logic cone dividing unit for dividing a first circuit description defining the structure and specification of the circuit to be designed in logic cone units, logic verification unit for verifying the logic by using the first circuit description and test vectors, profile information generating unit for storing the information about the logic cone in the first circuit description to be activated by the test vector during logic verification in every test vector as profile information, circuit changing unit for changing the first circuit description and generating a second circuit description, formal verification unit for verifying by formal technology using the first and second circuit descriptions, logic cone specifying unit for specifying a changed logic cone relating to the change in the second circuit description on the basis of the result of formal verification, and test vector classifying unit for classifying the test vectors into those activating the changed logic cone and others not by using the profile information.

A second feature of the present invention relates to a circuit designing method comprising a circuit description input step of entering a first circuit description defining the structure and specification of the circuit to be designed, a logic cone dividing step of dividing the first circuit description in logic cone units, a logic verification step of verifying the logic by using the first circuit description and test vectors, a profile information generating step of storing the information about the logic cone in the first circuit description to be activated by the test vector during logic verification in every test vector as profile information, a circuit changing step of changing the first circuit description and generating a second circuit description, a formal verification step of verifying by formal technology using the first and second circuit descriptions, a logic cone specifying step of specifying a changed logic cone relating to the change in the second circuit description on the basis of the result of formal verification, and a test vector classifying step of classifying the test vectors into those activating the changed logic cone and others not by using the profile information.

A third feature of the present invention relates to a computer-readable recording medium storing a circuit designing program for causing the computer to execute the processes comprising logic cone dividing process for dividing a first circuit description defining the structure and specification of the circuit to be designed in logic cone units, logic verification process for verifying the logic by using the first circuit description and test vectors, profile information generating process for storing the information about the logic cone in the first circuit description to be activated by the test vector during logic verification in every test vector as profile information, circuit changing process for changing the first circuit description and generating a second circuit description, formal verification process for verifying by formal technology using the first and second circuit descriptions, logic cone specifying process for specifying a changed logic cone relating to the change in the second circuit description on the basis of the result of formal verification, and test vector classifying process for classifying the test vectors into those activating the changed logic cone and others not by using the profile information.

Herein, as the computer-readable recording medium, preferably, semiconductor memory, magnetic disk, optical disk, magneto-optical disk, magnetic tape, digital video disk and others may be used.

Logic verification process of the second circuit description may be executed by using preferentially the test vector for activating the changed logic cone.

Logic verification includes various verifications of circuit description using test vectors, such as function verification and timing verification.

According to the circuit designing apparatus of the present invention, when the circuit description is changed in logic verification, changed points in the circuit description are automatically specified in logic cone units, and plural test vectors are classified into those relating to the changed points and others not, and in the second and subsequent logic verification processes, therefore, without using all test vectors, verification is possible by using only the test vectors relating to the changed points, so that the time required for circuit design may be curtailed substantially. If there are plural changed points, logic verification can be executed sequentially from the test vector having the strongest relation, and therefore if the change itself is defective, it can be detected earlier. Moreover, it is possible to analyze which part of the circuit is activated by a test vector, in the logic cone unit, by every test vector, so that the test vectors can be managed and controlled strictly.

Also, according to the circuit designing method of the present invention, when the circuit description is changed in logic verification, changed points in the circuit description are automatically specified in logic cone units, and plural test vectors are classified into those relating to the changed points and others not, and in the second and subsequent logic verification processes, therefore, without using all test vectors, verification is possible by using only the test vectors relating to the changed points, so that the time required for circuit design may be curtailed substantially. If there are plural changed points, logic verification can be executed sequentially from the test vector having the strongest relation, and therefore if the change itself is defective, it can be detected earlier. Moreover, it is possible to analyze which part of the circuit is activated by a test vector, in the logic cone unit, by every test vector, so that the test vectors can be managed and controlled strictly.

And also, according to the computer-readable recording medium storing a circuit designing program of the present invention, when the circuit description is changed in logic verification, changed points in the circuit description are automatically specified in logic cone units, and plural test vectors are classified into those relating to the changed points and others not, and in the second and subsequent logic verification processes, therefore, without using all test vectors, verification is possible by using only the test vectors relating to the changed points, so that the time required for circuit design may be curtailed substantially. If there are plural changed points, logic verification can be executed sequentially from the test vector having the strongest relation, and therefore if the change itself is defective, it can be detected earlier. Moreover, it is possible to analyze which part of the circuit is activated by a test vector, in the logic cone unit, by every test vector, so that the test vectors can be managed and controlled strictly.

Other and further objects and features of the present invention will become obvious upon understanding of the illustrative embodiments about to be described in connection with the accompanying drawings or will be indicated in the appended claims, and various advantages not refereed to herein will occur to one skilled in the art upon employing of the invention in practice.

DETAILED DESCRIPTION OF THE PREFERRED EMBODIMENTS

Figure 1:
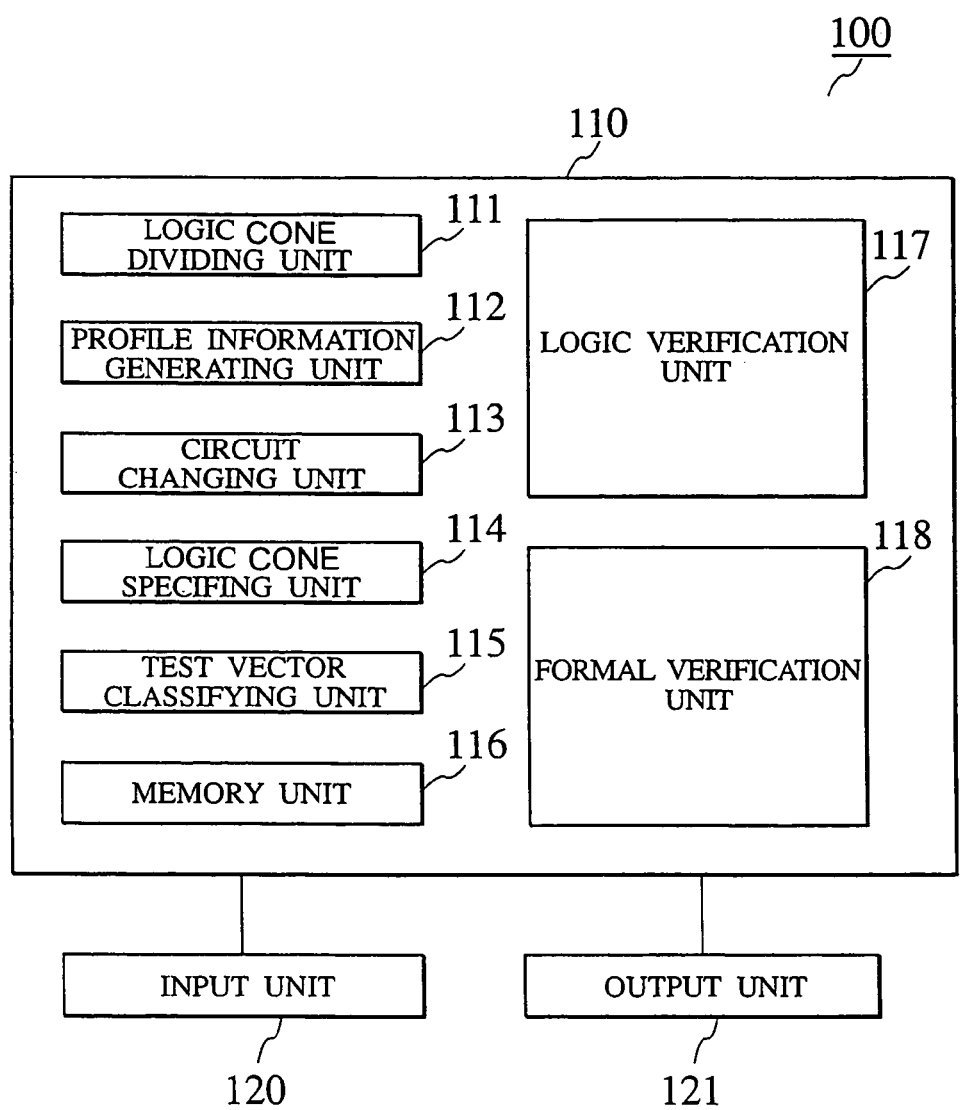
FIG. 1 is a block diagram showing a configuration of a circuit designing system in an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Prior to explanation of embodiments of the invention, the term "logic cone" used herein is briefly described below.

In the circuit designing apparatus, circuit designing method, and computer-readable recording medium storing a circuit designing program according to embodiments of the present invention, the prepared circuit description is divided into predetermined units called "logic cones", and the information about logic cones is intensively used in logic verification process. This logic cone has a same technical meaning as the logic cone obtained by general formal verification process, and in a conical region (see FIG. 4 and FIG. 5) defined in every register in the circuit description, information of input signal relating to output signal to outside of each register or circuit is described. Therefore, by utilizing the information relating to the logic cone, the information relating to input and output of signals, such as defects in input and output of signals, in all region of the circuit can be obtained.

Referring now to FIG. 1 to FIG. 4, the circuit designing apparatus, circuit designing method, and computer-readable recording medium storing a circuit designing program accruing to embodiments of the present invention are described in detail below.

(Circuit Designing System)

First, referring to FIG. 1, the configuration of the circuit designing system in an embodiment of the present invention is described below.

A circuit designing system 100 in the embodiment of the present invention comprises a circuit designing apparatus 110 for verifying the logic of the entered circuit description and correcting defects in the circuit description, input unit 120 for entering various parameters relating to the circuit description and circuit designing apparatus 110, and output unit 121 for issuing the corrected circuit description and error display, more specifically the circuit designing apparatus 110 includes logic cone dividing unit 111 for dividing a circuit description defining the structure and specification of the circuit to be designed entered from the input unit 120 in logic cone units, logic verification unit 117 for verifying the logic by using the circuit description and test vectors, profile information generating unit 112 for storing the information about the logic cone in the circuit description to be activated by the test vector used in logic verification during execution of logic verification in every test vector as profile information, circuit changing unit 113 for changing the entered circuit description, formal verification unit 118 for verifying by formal technology using the circuit description before and after change, logic cone specifying unit 114 for specifying a logic cone relating to the change in the changed circuit description on the basis of the result of formal verification (changed logic cone), test vector classifying unit 115 for classifying the test vectors into those activating the changed logic cone and others not, and memory unit 116 for storing the profile information and various data.

Herein, as the input unit, the keyboard, mouse, and other input devices may be used, and the information stored in a floppy disk or other memory medium may be read out in the circuit designing apparatus 110. As the output unit, it is preferred to use a display device such as display screen and a printing device such as printer. The memory unit includes semiconductor memory, magnetic disk, optical disk, magneto-optical disk, magnetic tape, digital video disk, and others. Herein, the "test vector activating the changed logic cone" may be interpreted as "test vector passing through the changed logic cone."

(Circuit Designing Method))

Figure 2:
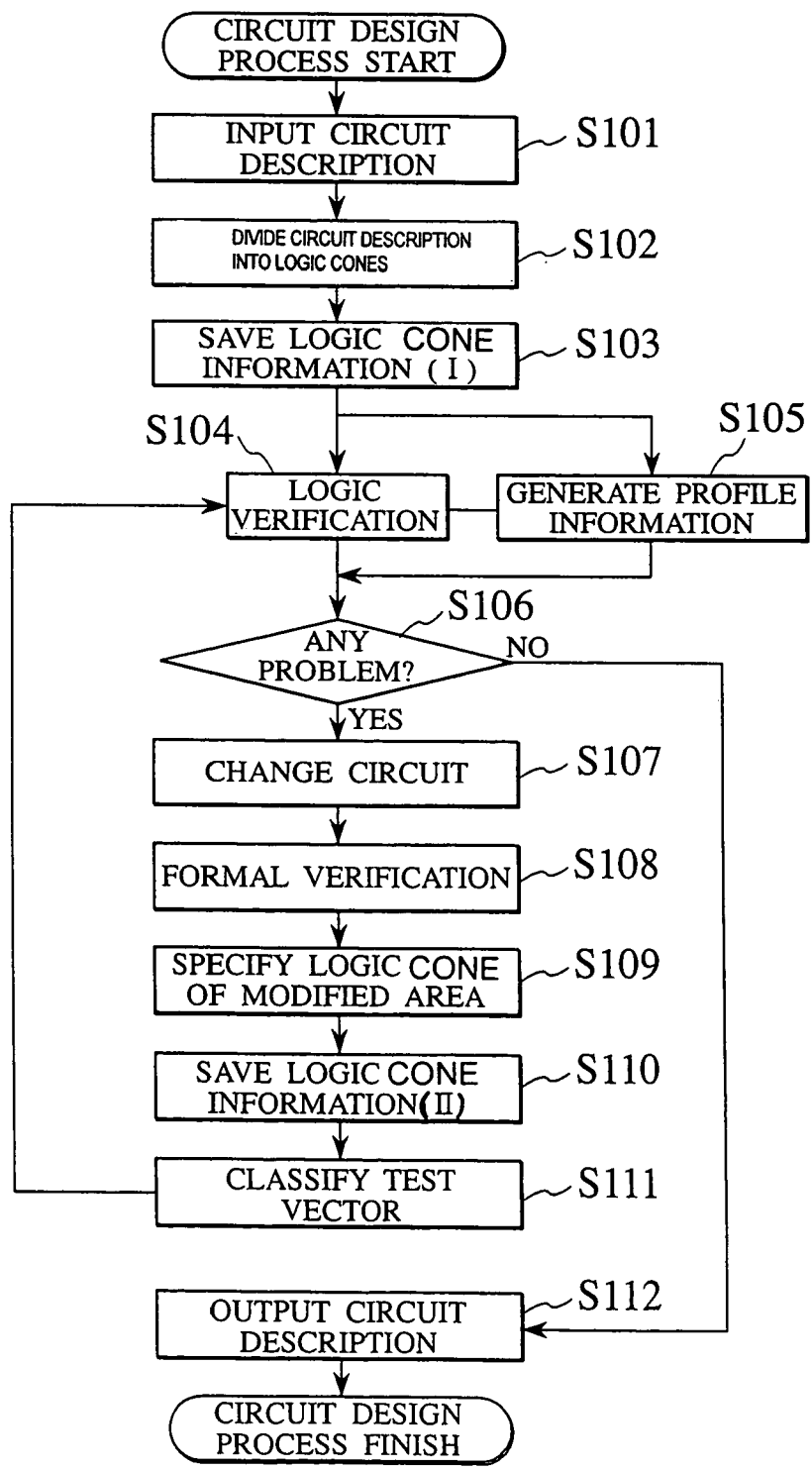
FIG. 2 is a flowchart showing a circuit designing method in an embodiment of the present invention.

Referring next to FIG. 2, a circuit designing method according to an embodiment of the present invention is explained.

When designing the circuit according to the circuit designing method in the embodiment of the present invention, following processing steps is executed.

1. A first circuit description defining the structure and specification of the circuit to be designed is entered (circuit description input step, S101).

2. The first circuit description is divided in logic cone units (logic cone dividing step, S102).

3. The composition of logic cone in the first circuit description is stored so that the input and output information may be stored in every logic cone in the first circuit description (logic cone information storing (I) step, S103).

4. The logic is verified by using all test vectors necessary for first circuit description and verification (logic verification step, S104).

5. Information relating to the logic cone in the circuit description activated by each test vector used in logic verification during execution of logic verification step S104 (for example, information about test vector and logic cone activated by test vector) is stored as profile information in each test vector (profile information generating step, S105).

6. As a result of verification, judging if the desired function is realized by the first circuit description or not (defect judging step, S106), and when realized, the process goes to circuit description output step (S112), and if not realized, to circuit change step (S107).

7. In order to realize the desired function, the first circuit description is changed, and a second circuit description is prepared (circuit change step, S107).

8. Verifying by formal technology using the first and second circuit descriptions (formal verification step, S108).

9. On the basis of the result of formal verification, the logic cone relating to the change in the second circuit description (changed logic cone) is specified (logic cone specifying step, S109).

10. Composition of logic cone in the second circuit description is stored so that input and output information may be stored in every logic cone within the second circuit description (logic cone information storing (II) step, S110).

11. Using the information relating to the changed logic cone and profile information, the test vectors used at the logic verification step S104 are classified into those activating the changed logic cone region and others not (test vector classifying step, S111), and only those activating (activating vectors) or test vectors greater in the number of activating logic cones are entered by priority in the circuit description, and the process after logic verification step (S104) is executed again.

12. Finally, by output of circuit description, using the corresponding circuit description, the mask pattern design, and subsequent circuit design, and manufacturing process are executed (circuit description output step, S112).

Thus, in the circuit designing method according to the embodiment of the present invention, when the circuit description is changed in logic verification, changed points in the circuit description are automatically specified in logic cone units, and plural test vectors are classified into those relating to the changed points and others not, and in the second and subsequent logic verification processes, therefore, without using all test vectors, verification is possible by using only the test vectors relating to the changed points, so that the time required for circuit design may be curtailed substantially. If there are plural changed points, logic verification can be executed sequentially from the test vector having the strongest relation, and therefore if the change itself is defective, it can be detected earlier. Moreover, it is possible to analyze which part of the circuit is activated by a test vector, in the logic cone unit, by every test vector, so that the test vectors can be managed and controlled strictly.

It must be noted that the logic verification process mentioned in the specification includes various verifications of circuit description using test vectors, such as function verification and timing verification.

Figure 3:
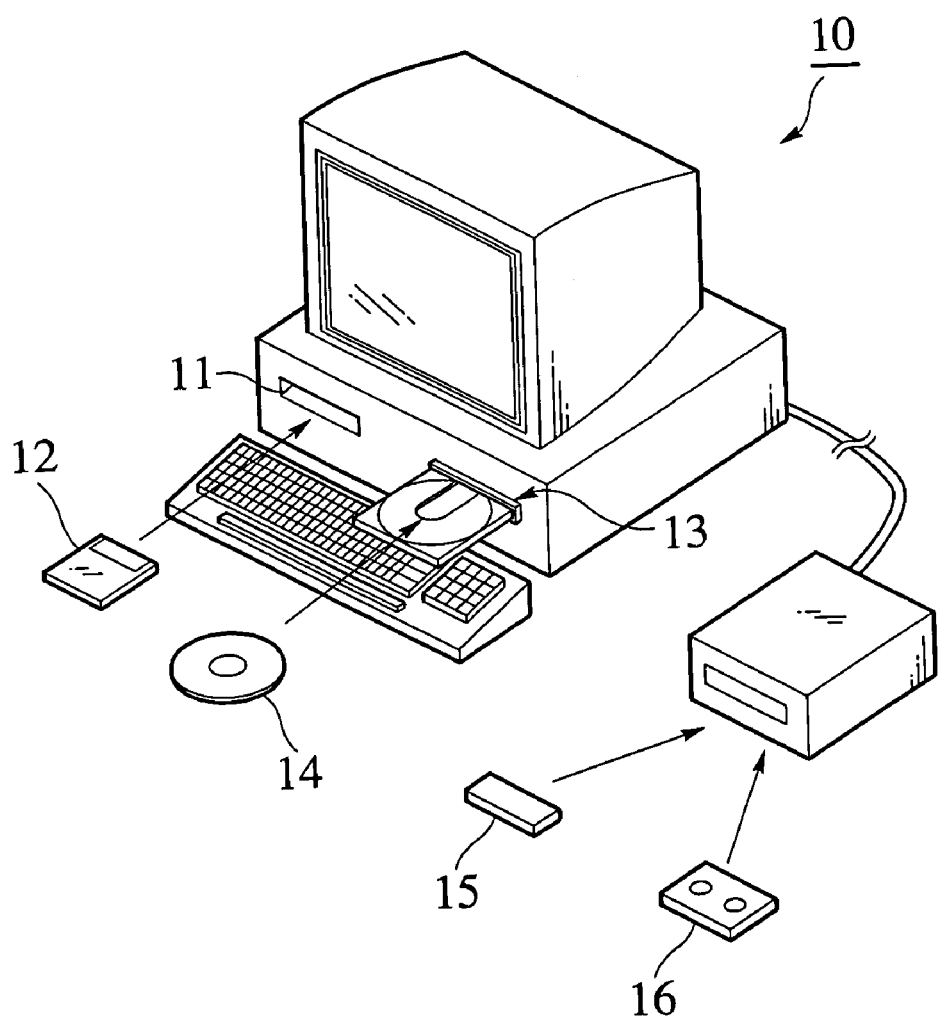
FIG. 3 is a flowchart showing an outline of a circuit designing system in an embodiment of the present invention.

The circuit designing system 100 in the embodiment of the invention has an outlook as shown, for example, in FIG. 3. That is, the circuit designing system 100 according to the embodiment of the present invention is composed by incorporating the elements of the circuit designing apparatus 110 within the computer system 10. The computer system 10 includes a floppy disk drive 11 and an optical disk drive 13. A floppy disk 12 is inserted into the floppy disk drive 11, and an optical disk 14 is inserted into the optical disk drive 13, and by specified reading operation, the circuit designing programs stored in these recording media can be installed in the computer system 10. By connecting a proper drive device to the computer system 10, for example, a circuit designing program can be also installed by using a ROM 15 playing the role of memory device, or a cartridge 16 playing the role of a magnetic tape device.

The circuit designing apparatus 110 according to the embodiment of the present invention may be also programmed and stored in a computer-readable recording medium. When executing the circuit designing program, this recording medium is read in the computer system, and the circuit designing program is stored in the recording unit such as memory in the computer system, and by executing the process in the circuit designing program, the circuit designing apparatus and its method of the embodiment of the present invention can be realized on the computer system. Herein, the recording medium includes, for example, semiconductor memory, magnetic disk, optical disk, magneto-optical disk, magnetic tape, digital video disk, and others that can record programs and can be read by a computer.

Finally, for deepening the understanding about the logic verification process in the circuit designing method of the invention, referring to FIG. 4 and FIG. 5, an example of logic verification process by using the circuit designing method of the present invention is briefly explained below.

Figure 4A:
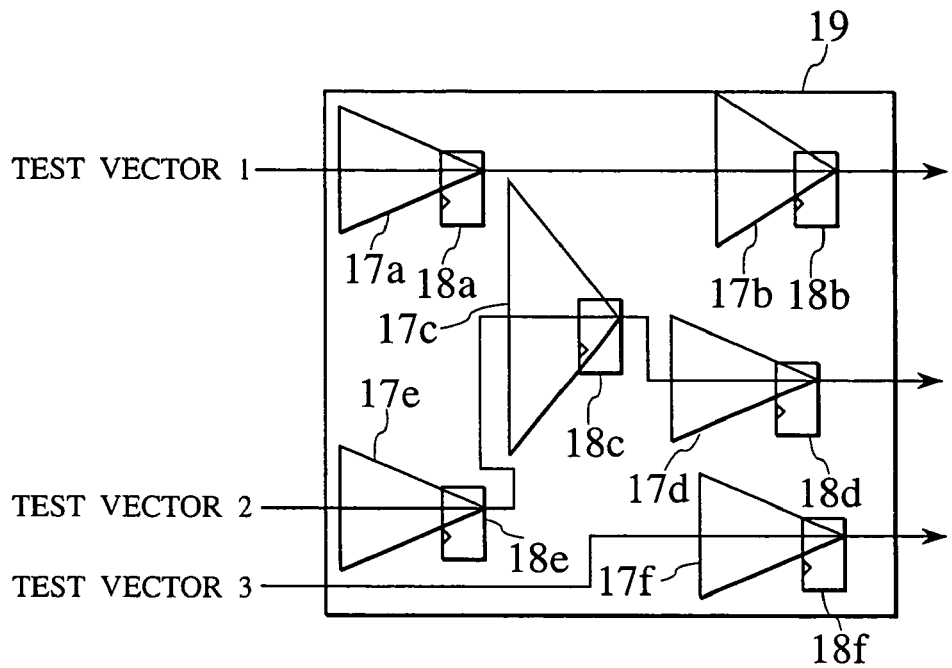
FIG. 4 is a diagram showing an experimental example for explaining the logic verification process by the circuit designing method of the present invention.
Figure 4B:
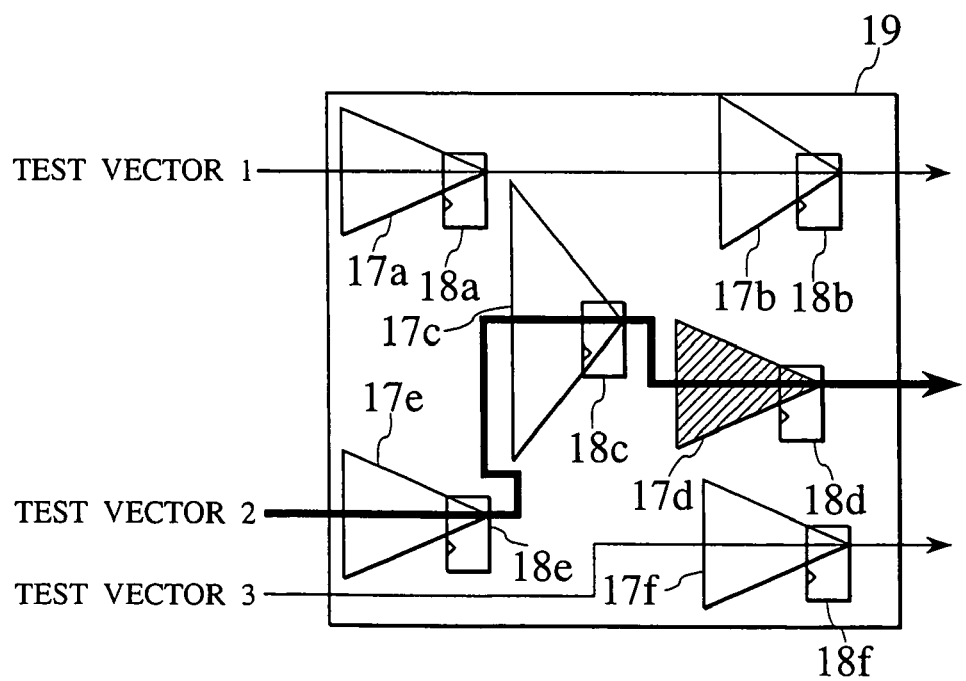
Figure 5A:
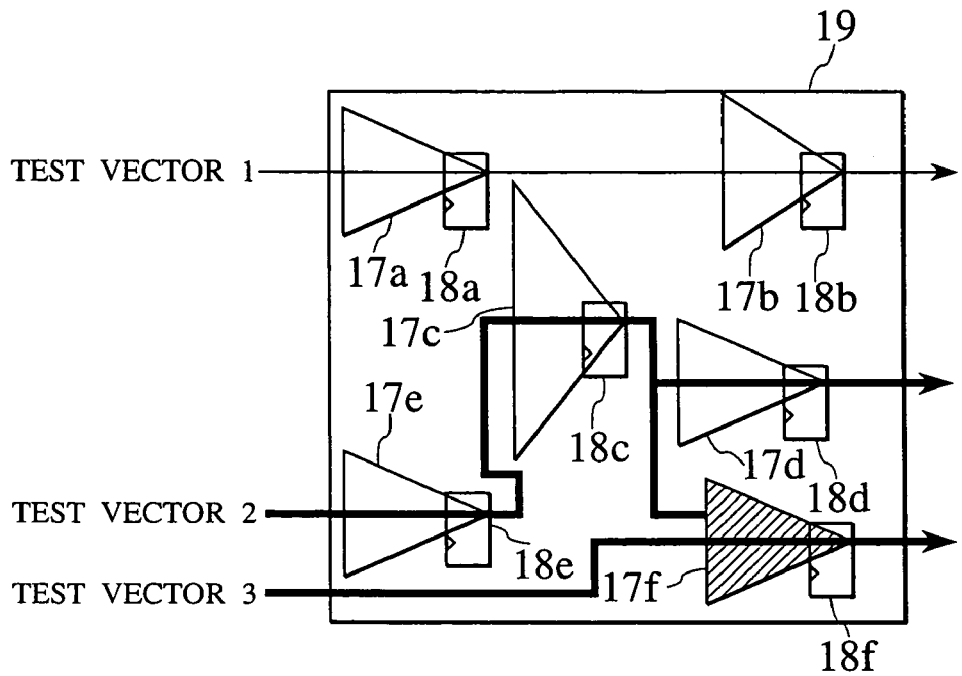
FIG. 5 is a diagram showing an experimental example for explaining the logic verification process by the circuit designing method of the present invention.
Figure 5B:
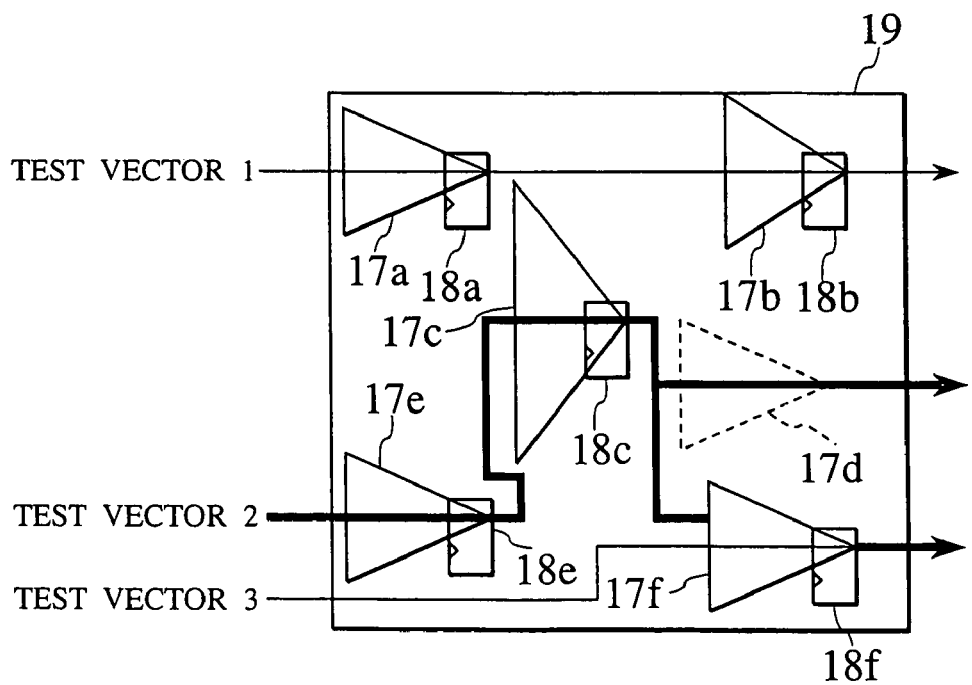

Suppose a first circuit description defining the structure and specification is prepared as shown in FIG. 4 (*a*).

In logic verification of the first circuit description by the circuit designing method of the present invention, (1) First, all test vectors 1 to 3 necessary for logic verification of the first circuit description are entered, and the logic is verified.

(2) During logic verification, the information of each one of the test vectors 1 to 3 activating which logic cone in the first circuit description is stored as profile information. In this case, specifically, the information of the test vector 1 activating logic cones 17*a*, 17*b*, test vector 2 activating logic cones 17*e*, 17*c*, 17*d*, and test vector 3 activating logic cone 17*f* is stored in the profile information.

(3) Referring to the result of logic verification, the first circuit description is changed, and a second circuit description as shown in FIG. 4 (*b*) is prepared.

(4) Verifying by formal technology using the first and second circuit descriptions and it is specified which logic cone in the second circuit description has been changed. In this example, the logic cone 17*d* is changed, and it is assumed to be a changed logic cone.

(5) Using the profile information, a vector for activating the changed logic cone 17*d* (activating vector) is specified from the test vectors 1 to 3. In this example, it is supposed that the test vector 2 activates the logic cone 17*d*.

(6) Only the test vector 2 is put in the circuit description, and a second logic verification is executed.

In this example, if a new defect is detected in the second circuit description, the second circuit description is regarded as the first circuit description, and the same process is executed again. In this case, therefore, verifying by using formal technology in the second circuit description and third circuit description, and as a result of formal verification, if it is found that the output of the logic cone 17*c* has been newly added to the input of the logic cone 17*f*, the test vectors activating the logic cones 17*c* and 17*f* are searched by using the profile information of the second circuit description (in this case, the stored information shows the test vector 1 activating logic cones 17*a*, 17*b*, test vector 2 activating logic cones 17*e*, 17*c*, 17*d*, and test vector 3 activating logic cone 17*f*). As a result, it is found that the test vectors 2 and 3 are activating the logic cones 17*c* and 17*f*, and in this stage, using the test vectors 2 and 3 only, the logic is verified. When a new circuit occurs in the third circuit description, similarly, verifying by using formal technology in the third circuit description and fourth circuit description, and as a result of formal verification, if it is found that the logic cone 17*d* has been deleted, the test vector activating the logic cone 17*d* is searched by using the profile information of the third circuit description (in this case, the stored information shows the test vector 1 activating logic cones 17*a*, 17*b*, test vector 2 activating logic cones 17*e*, 17*c*, 17*d*, 17*f* and test vector 3 activating logic cone 17*f*). As a result, it is found that the test vector 2 is activating the logic cone 17*d*, and in this stage, using the test vector 2 only, the logic is verified.

Other Embodiments

Various modifications will become possible for those skilled in the art after receiving the teachings of the present disclosure without depending from the scope thereof.

Thus, the invention includes various embodiments not mentioned herein. Therefore, the technical scope of the invention is determined only by the following claims as rationally understood from the description above.

What is claimed is:

1. A circuit designing apparatus comprising:
   a logic verification unit configured to input a plurality of test vectors necessary for a logic verification to a circuit description defining a structure and a specification of a circuit to be designed, to compare an output signal of the circuit description with an expected value of the output signal, and to judge the validity of the circuit description in accordance with a result of the comparison;
   a profile information generating unit configured to detect information about a plurality of logic cones in the circuit description to be activated by the test vectors during the logic verification, for each test vector, and to generate a profile information relating the test vector to the logic cones activated by the test vector;
   a circuit changing unit configured to change the circuit description after the logic verification and to generate a changed circuit description;
   a logic cone specifying unit configured to specify changed logic cones of the changed circuit description, based on a result of a formal verification; and
   a test vector classifying unit configured to classify the test vectors into test vectors that activate the changed logic cones and test vectors that do not activate the changed logic cones, by searching for the test vectors related to the changed logic cones in the profile information,
   wherein the logic verification unit inputs the test vectors that activate the changed logic cones into the changed circuit description, compares an output signal of the changed circuit description with an expected value of the output signal, and judges the validity of the changed circuit description in accordance with a result of the comparison.

2. The circuit designing apparatus of claim 1, further comprising:

a logic cone dividing unit configured to divide the circuit description into the logic cones; and a formal verification unit configured to verify logic by formal technology using the circuit description and the changed circuit description.

3. A circuit designing method comprising:

inputting a plurality of test vectors necessary for a logic verification to a circuit description defining a structure and a specification of a circuit to be designed;

comparing an output signal of the circuit description with an expected value of the output signal;

judging the validity of the circuit description in accordance with a result of the comparison;

detecting information about a plurality of logic cones in the circuit description to be activated by the test vectors during the logic verification, for each test vector;

generating a profile information relating the test vector to the logic cones activated by the test vector;

changing the circuit description after the logic verification;

generating a changed circuit description;

specifying changed logic cones of the changed circuit description based on a result of a formal verification;

classifying the test vectors into test vectors that activate the changed logic cones and test vectors that do not activate the changed logic cones, by searching for the test vectors related to the changed logic cones in the profile information;

inputting the test vectors that activate the changed logic cones into the changed circuit description;

comparing an output signal of the changed circuit description with an expected value of the output signal; and judging the validity of the changed circuit description in accordance with a result of the comparison.

4. The circuit designing method of claim 3, further comprising:

dividing the circuit description into the logic cones; and verifying logic by formal technology using the circuit description and the changed circuit description.

5. The circuit designing method of claim 3, wherein the logic verification of the changed circuit description is executed by using preferentially the test vectors that activate the changed logic cones.

6. The circuit designing method of claim 4, further comprising issuing a circuit description and processing circuit manufacture by using the circuit description.

7. The circuit designing method of claim 5, further comprising issuing a circuit description and processing circuit design and manufacture by using the circuit description.

8. A computer-readable recording medium storing a circuit designing program comprising and making a computer execute:

instructions configured to input a plurality of test vectors necessary for the logic verification into a circuit description defining a structure and a specification of a circuit to be designed;

instructions configured to compare an output signal of the circuit description with an expected value of the output signal;

instructions configured to judge the validity of the circuit description in accordance with a result of the comparison;

instructions configured to detect information about a plurality of logic cones in the circuit description to be activated by the test vectors during the logic verification, for each test vector;

instructions configured to generate a profile information relating the test vector to the logic cones activated by the test vector;

instructions configured to change the circuit description after the logic verification and to generate a changed circuit description;

instructions configured to specify changed logic cones of the changed circuit description based on a result of a formal verification;

instructions configured to classify the test vectors into test vectors that activate the changed logic cones and test vectors that do not activate the changed logic cones, by searching for the test vectors related to the changed logic cones in the profile information;

instructions configured to input the test vectors that activate the changed logic cones into the changed circuit description;

instructions configured to compare an output signal of the changed circuit description with an expected value of the output signal; and instructions configured to judge the validity of the changed circuit description in accordance with a result of the comparison.

9. The computer-readable recording medium storing a circuit designing program of claim 8, wherein the logic verification of the changed circuit description is executed by using preferentially the test vectors that activate the changed logic cones.

10. The computer-readable recording medium storing a circuit designing program of claim 8, further comprising and making the computer execute:

instructions configured to output a circuit description, wherein circuit manufacture is processed by using the circuit description.

11. The computer-readable recording medium storing a circuit designing program of claim 8, further comprising and making the computer execute:

instructions configured to divide the circuit description into the logic cones; and instructions configured to verify by formal technology using the circuit description and the changed circuit description.

12. The circuit designing apparatus of claim 1, wherein the logic verification of the changed circuit description is executed by using preferentially the test vectors that activate the changed logic cones.

13. The circuit designing apparatus of claim 1, wherein the second and subsequent logic verifications are executed by using only the test vectors that activate the changed logic cones.

14. The circuit designing apparatus of claim 2, wherein the logic cone specifying unit specifies the changed logic cones on the basis of a result of the formal verification.

15. The circuit designing method of claim 3, wherein the second and subsequent logic verifications are executed by using only the test vectors that activate the changed logic cones.

16. The computer-readable recording medium storing a circuit designing program of claim 8, wherein the second and subsequent logic verifications are executed by using only the test vectors that activate the changed logic cones.

* * * * *